(12) United States Patent
Hein et al.

(10) Patent No.: US 6,960,735 B2
(45) Date of Patent: Nov. 1, 2005

(54) MULTI-SHOT MOLDED TOUCH SWITCH

(75) Inventors: David A. Hein, Sterling Heights, MI (US); Michael W. Cass, Lenox, MI (US); Todd L. DePue, Brighton, MI (US); Charles B. Banter, Northville, MI (US)

(73) Assignee: Lear Corporation, Southfield, MI (US)

( * ) Notice: Subject to any disclaimer, the term of this patent is extended or adjusted under 35 U.S.C. 154(b) by 82 days.

(21) Appl. No.: 10/802,193

(22) Filed: Mar. 17, 2004

(65) Prior Publication Data

US 2005/0205407 A1 Sep. 22, 2005

(51) Int. Cl.⁷ .......................................... H01H 17/975
(52) U.S. Cl. .................................................... 200/600
(58) Field of Search ........................ 200/5 A, 512–517, 200/600; 341/27, 33; 345/173

(56) References Cited

U.S. PATENT DOCUMENTS 4,562,315 A * 12/1985 Aufderheide ............... 200/5 A
5,465,091 A    11/1995 Nishino et al.
5,760,715 A     6/1998 Senk et al.
6,310,611 B1 * 10/2001 Caldwell .................... 345/173
6,529,122 B1    3/2003 Magnussen et al.
2002/0144886 A1 10/2002 Engelmann et al.
2003/0121766 A1  7/2003 Chen et al.
2003/0159910 A1  8/2003 Caldwell

* cited by examiner

Primary Examiner—James R. Scott
(74) Attorney, Agent, or Firm—Bill C. Panagos

(57) ABSTRACT

A conductive plastic touch switch includes a plastic substrate having a first side surface including at least two channels formed within the first side surface and a second side surface including a manual activation region opposite of the at least two channels. At least two conductive traces are formed within the at least two channels, respectively. A printed circuit board is electrically attached to the at least two conductive traces. The plastic substrate is formed during a first mold process and said at least two conductive traces are in-molded during a second mold process.

13 Claims, 2 Drawing Sheets

MULTI-SHOT MOLDED TOUCH SWITCH

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

1. Field of the Invention

The present invention relates in general to a touch sensitive switch, and more specifically, to a conductive plastic sensitive touch switch integrated with the surface of a control panel by a multi-shot mold process.

2. Description of the Related Art

Vehicle accessory input controls typically consist of devices which require rotating a control knob, depressing a control button, or sliding a mechanical or electro-mechanical control switch to operate or adjust a vehicle accessory device. An exterior casing or oversize buttons and knobs are typically used to dress up and conceal the gaps between the bezel and the movable components of the input control devices. Despite the addition of these facial coverings to make the appearance presentable and visually appealing, the plurality of interlocking components leaves way for dirt and debris to lodge in the gaps and crevices between these interlocking components. Devices such as appliances have been known to use switches under the surface of a fascia of the appliance to create a sealed environment, however, these devices have been limited to a physical press and release operation.

Capacitance sensors have also been for switch actuation. A capacitance sensor disposed under a surface fascia creates an electric field above the surface fascia. If an object is displaced within the electric field, a change of capacitance indicates a request by an operator to actuate a switch. Because the capacitance sensor and the fascia unit are separate components, both units are assembled together at some point during an assembly process. As a result, a misalignment condition due to assembly errors or component stack-up tolerancing can occur between the capacitance sensor mounted below the surface fascia and the expected manual activation region identified by an exterior marking on the surface fascia. This ultimately can lead to non-activation of the switch if the object is not properly placed within the generated electric field and dissatisfaction of an operator in attempting to actuate the switch.

SUMMARY OF THE INVENTION

The present invention has the advantage of integrally forming a touch switch with a control panel using a multi-shot molding process, said touch switch formed by molding a plastic substrate in a first-shot mold including a plurality of channels and forming conductive plastic traces within said plurality of channels in a second-shot mold.

A conductive plastic touch switch includes a plastic substrate having a first side surface including at least two channels formed within the first side surface and a second side surface including a manual activation region opposite of the at least two channels. At least two conductive traces formed within the at least two channels, respectively. A printed circuit board is electrically attached to the at least two conductive traces. The plastic substrate is formed during a first mold process and said at least two conductive traces are in-molded during a second mold process.

DETAILED DESCRIPTION OF PREFERRED EMBODIMENTS

Figure 1:
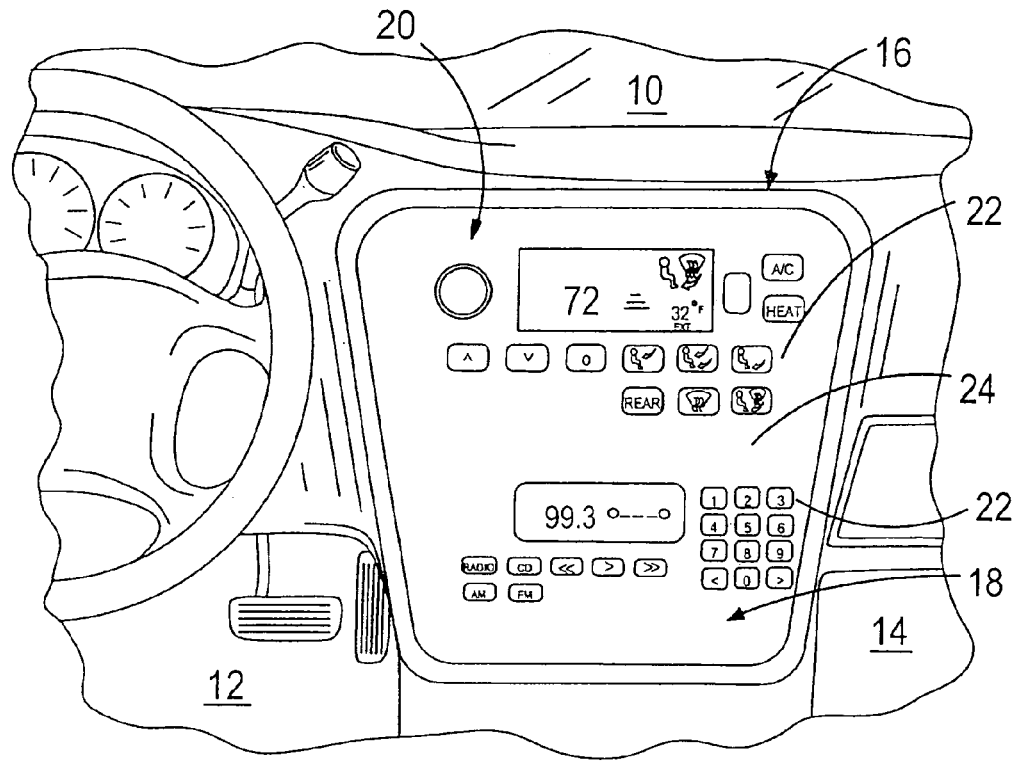
FIG. 1 is a perspective view of an instrument control panel for controlling vehicle accessories.

Referring now to the Drawings and particularly to FIG. 1, there is shown an interior passenger compartment 10 of a vehicle according to the present invention. The interior passenger compartment 10 comprises a front drivers seating area 12, a front passenger seating area 14, and a center accessory control unit 16. The center accessory control unit 16 includes a multimedia control unit 18 and a climate control unit 20. Both control units include a plurality of switches (e.g., buttons) 22 for controlling a specific feature of each respective accessory. For example, the multimedia control unit 18 typically includes switches for controlling multimedia selections such as CD, radio, AM/FM, fast forward, reverse, and preset memory. The climate control unit 20 typically includes switches for controlling temperature increase/decrease, defrost, A/C, blower motor, and blower motor output porting.

The plurality of switches 22 is disposed under a surface of a bezel 24 and is directed toward the interior of the vehicle for sensing an object (e.g., finger) in close proximity to a respective switch. In the preferred embodiment, the plurality of switches 22 each comprises at least two conductive plastic traces for capacitance sensing. The at least two conductive plastic traces generate electric fields in a manual activation region above surface of the bezel 24. The conductive plastic traces are monitored for a changes of capacitance in the manual activation region of each switch. The object displaced within the manual activation region changes the capacitance generated between a respective conductive trace and the surface of the bezel. Changes in the capacitance of each electric field generated by each conductive trace are compared. If both changes in capacitance are within a predetermined threshold, then a determination is made that the switch was intended for actuation. If both changes in capacitance are not within a predetermined threshold, then a determination is made that the respective switch was not intended for actuation. The sensed change in the capacitance is associated with an operator's request to actuate a corresponding accessory function. As a result, each switch may be activated without having to actually contact the surface of a respective switch on the bezel 24. Since the plurality of switches 22 are mounted within the bezel 24 (or other interior trim panel) and generates electric fields to an area exterior to the skin of the bezel 24, gaps and cut lines typically associated with mechanical switches, levels, buttons, dials, and control knobs are eliminated. This provides for an aesthetically pleasing appearance of an instrument or trim panel wherein the plurality of switches 22 is substantially inconspicuous. Such a switch mounted below the surface of a bezel is shown in co-pending application entitled "A Vehicle Accessory Proximity Sensor Slide Switch", Ser. No. 10/742,341, filed Dec. 19, 2003, and co-pending application entitled "Touch Pad For Motor Vehicle And Sensor Therewith", Ser. No. 10/744,168, filed Dec. 22, 2003.

Since the plurality of switches 22 are non-visible and substantially inconspicuous, the plurality of switches 22 may further comprise graphics or other indicators printed on an exterior surface of each respective switch to identify the location of each respective switch and its associated functionality.

Figure 2:
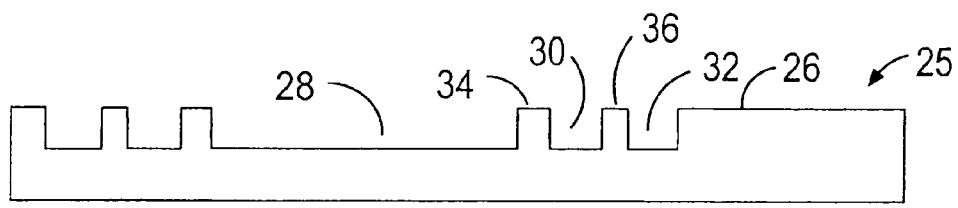
FIG. 2 is a cross-sectional view of a first shot molded plastic substrate according to the preferred embodiment of the present invention.
Figure 4:
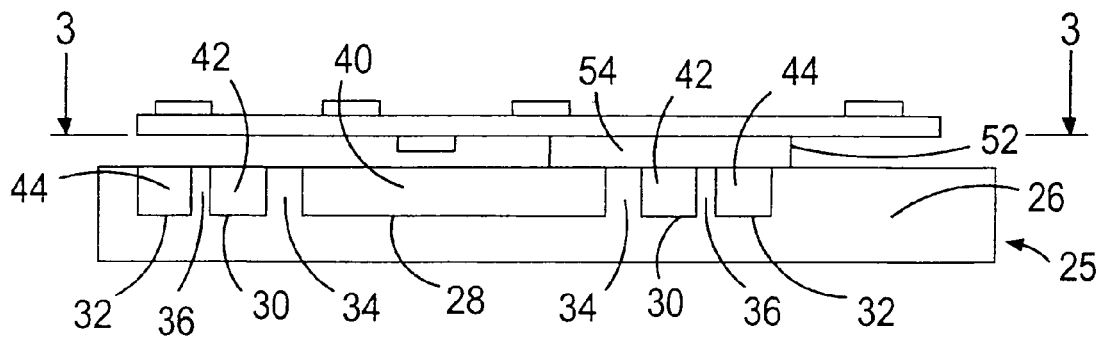
FIG. 4 is a cross-sectional view of a touch switch electrically attached to a printed circuit board according to the preferred embodiment of the present invention.

In FIG. 2, a plastic substrate 25 is formed in a first-shot mold operation. The plastic substrate 25 is preferably injection molded using an electrically insulating plastic composite material. The formed plastic substrate includes a first side surface 26 having recesses therein. The recesses form a plurality of channels each arranged in a respective pattern. The plurality of channels has a respective predetermined length, width, and depth for supporting a respective electrical conductor. Electrical conductors formed thereafter are excited with a voltage source to create the electric field. In a preferred embodiment, a central channel 28 is formed within the first side surface 26. The central channel 28 is square-like, however, any concentric-like pattern may be formed. A first peripheral channel 30 is arranged successively outward from the central channel and is formed about the periphery of the central channel 28. The first peripheral channel 30 is open looped such that the first peripheral channel 28 does not form a complete square. The central channel 28 and the first peripheral channel 30 are separated by a first plastic partitioning wall 34 of a predetermined thickness. The central channel 28 consumes an entire surface area within an inner perimeter of first plastic partition wall 36.

In a second preferred embodiment, a second peripheral channel 32 may be formed successively outward of the first peripheral channel 30. A second plastic partitioning wall 36 of a second predetermined thickness separates the first peripheral channel 30 from the second peripheral channel 32. Alternatively, the first plastic partitioning wall 34 and the second plastic partitioning wall 36 may be the same thickness. The second peripheral channel 32 forms a proportional square-like pattern similar to, yet smaller in perimeter to the first peripheral channel 30. The width and depth of the first peripheral channel 30 and the second peripheral channel 32 may be the same. The second channel 30 is also arranged in an open loop. An extended portion of each channel (shown in FIG. 3) extends beyond the squared-like pattern of each channel for reasons discussed infra.

Figure 3:
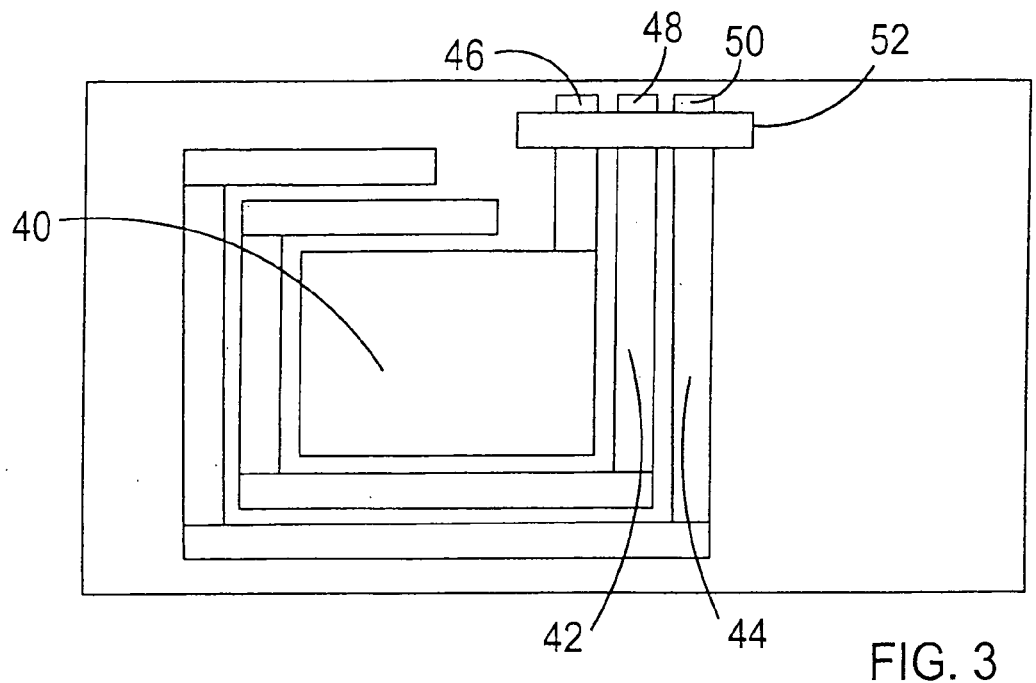
FIG. 3 is a back-view of a multi-shot touch switch integrating plastic conductive traces in the preferred embodiment of the present invention.

FIG. 3 illustrates conductive traces formed within the plastic substrate 25. After plastic substrate 25 has been formed in the first-shot mold operation, a plurality of conductive plastic traces are formed within each of the channels in a second-shot molding operation. In the preferred embodiment, a central conductive plastic plate 40 and a second conductive plastic trace 42 are molded within the central channel 28 and the first peripheral channel 30, respectively. Portions of the central conductive plastic plate 46 and portions of the second conductive trace 48 may extend beyond the open-ended square-like pattern for connection to an electrical connector.

The plastic conductive traces 40 and 42 are formed from plastic polymers. Typically, plastics are generally insulative. Their resistance for allowing electron passage is generally greater than $10^{15}$ ohms. However conductive modifiers of low resistance doped with plastics can be melted and blended to alter the overall resistance of the plastic polymer. As the resistance through the plastic polymer is lowered, the electrons are allowed to move thereby increasing the conductivity of the plastic polymer. For example, for a moderate conductivity involving conductive plastics, adding conductive carbon to the plastic polymer may lower the resistivity to a range between $10^3$ to $10^7$ ohms/sq. For high conductivity of plastic polymers, carbon or stainless steel fibers are added to achieve resistivity of $10^2$ ohms/sq. or lower.

Alternatively, conductive traces may be pre-formed and inserted into the formed channels of the plastic substrate 25 after the first-shot mold operation. The at least two conductive traces are then over-molded in a second-shot operation.

By forming channels in a first mold operation and then molding conductive plastic traces into the channels in a second mold operation, any misalignment between a graphic display printed on the exterior of switch (indicating to the operator the location of an expected manual activation region) and activation region generated by the conductive plastic traces is eliminated. That is, graphics or other indicators are printed on the exterior surface of the bezel (e.g., second side surface of the plastic substrate) to indicate to the operator or a passenger of the location of switch and the manual activation region where the operator or passenger must locate their finger to actuate a switch. By molding the channels to the first side surface 26 relative the graphics on the second side surface, any misalignment of the conductive traces thereafter formed into the channels is eliminated. The conductive plastic traces molded into the channels generate the electric fields within the manual activation region for a respective switch as indicated by the graphics displayed. Furthermore, light pipes may be molded within the plastic substrate 25 for providing a passageway of light from a source of light on the printed circuit board 25 to the second side surface for illuminating the second side surface.

A third conductive plastic trace 44 may be molded into the second peripheral channel 32. The third conductive trace 44 is a ground circuit to further assist in differentiating between two adjacent switches when an object is in close proximity to both adjacent switches. A portion of the third conductive plastic trace 50 extends beyond the square-like pattern of the third conductive plastic trace for electrically attaching to the electrical connector 52. The electrical connector 52 may include a zebra connector for electrically connecting all three conductive plastic traces to a printed circuit board 54. The printed circuit board 54 is juxtaposed to the first side surface 26. The zebra connector includes alternating conductive and nonconductive sections. The conductive sections are vertically orientated allowing electrical contact from top to bottom when the zebra connector is positioned horizontally. The alternating nonconductive sections insulate the conducting layers from one another. The zebra connector may be made of a sponge or a silicone rubber. Each contact point of the printed circuit board is compressed against a respective conductive section of the zebra connector which inturn contacts an associated conductive plastic trace. The circuit board is then mechanically attached to the first side surface using a mechanical fastener (not shown) such as screws. Alternatively, glue, clips or other mechanical fastening means may be utilized to secure the printed circuit board 54 to the plastic substrate 25. The zebra connector is thereby embedded between the printed circuit board 54 and the plastic substrate 25, and as a result, no holder is required for maintaining the zebra connector in alignment.

The printed circuit board 54 comprises a low voltage signal generator (not shown) for applying a low voltage to the first and second conductive plastic traces 40 and 42 for generating electric fields between each conductive trace and the surface of the bezel. The printed circuit board 54 further comprises a sensing circuit for sensing a change in capacitance within the manual activation region which is representative of the operator request for the actuation of a vehicle accessory function. A respective signal is thereafter supplied to an associated vehicle accessory or controller for controlling the functionality of the vehicle accessory.

Figure 5:
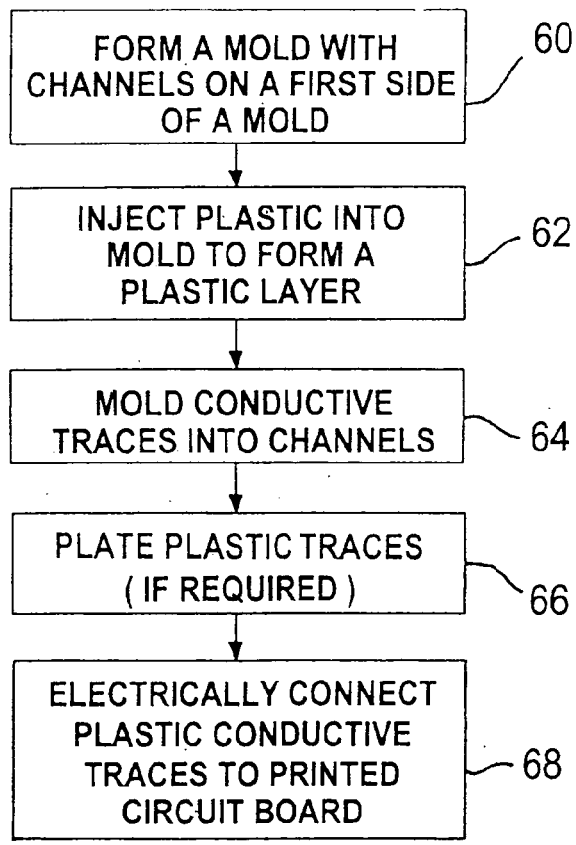
FIG. 5 is a flow chart for a method for forming the multi-shot touch switch for the present invention.

FIG. 5 illustrates flowchart for a method for forming a touch switch from a multi-shot mold process. In step 60, a mold is provided for forming a plastic substrate. The plastic substrate may be an instrument panel, bezel, or any other interior trim panel of a vehicle. In step 62, a plastic liquid is injected in the mold to form the plastic substrate. Preferably, an injection mold process is used to form the plastic substrate. At least two recesses in the form of channels are molded into the first side surface of the plastic substrate. The channels are arranged in a concentric pattern wherein a subsequent channel is molded inward of one another. The two channels formed may be molded at different depths so that the conductive traces are formed on different planes. A third channel is formed outward of the other channels. In step 64, the mold is reconfigured and a plastic conductive polymer is formed in each of the channels in a second-shot mold operation to form conductive plastic traces. A portion of each conductive plastic trace may extend to an edge for attachment to a connector. In step 66, the conductive plastic traces are plated with a conductive modifier utilizing an electroplating process to further enhance the conductivity of the conductive plastic traces, if desired. In step 68, the conductive plastic traces are electrically connected to respective contacts of a printed circuit board. A zebra connector may be used to electrically connect the conductive plastic traces to the respective contacts of the printed circuit board. The zebra connector is a flexible, rubberized material having alternating conductive and non-conductive sections. The zebra connector is compressed between the plastic substrate and the printed circuit board so that no separate holder is required for the zebra connector.

What is claimed is:

1. A conductive plastic touch switch, the touch switch comprising:
    a plastic substrate having a first side surface including at least two channels formed within said first side surface and a second side surface including a manual activation region opposite of said at least two channels;
    at least two conductive traces formed within said at least two channels respectively; and
    a printed circuit board electrically attached to said at least two conductive plastic traces;
    wherein said plastic substrate is formed during a first mold process and said at least two conductive plastic traces are in-molded during a second mold process.

2. The touch switch of claim 1 wherein said at least two conductive traces are plastic conductive traces formed during said second mold process.

3. The touch switch of claim 2 wherein said at least two conductive plastic traces are arranged in a pattern at a predetermined distance apart, said at least two conductive plastic traces generating an electric field with said manual activation region when a predetermined voltage is applied to said at least two conductive traces.

4. The touch switch of claim 3 wherein capacitances generated by said two conductive plastic traces varies in response to an object selectably disposed within said manual activation region.

5. The touch switch of claim 4 wherein at least two conductive plastic traces are plated with a conductive modifier for increasing said conductivity of said at least two conductive plastic traces.

6. The touch switch of claim 5 wherein said conductive modifier is plated on said two conductive plastic traces in an electroplating process.

7. The touch switch of claim 1 further comprising a zebra connector for electrically connecting said printed circuit board to said at least two conductive traces.

8. The touch switch of claim 1 further comprising a third channel formed within said first side surface, wherein a ground trace is molded within said third channel.

9. The touch switch of claim 1 wherein said interior trim panel comprises an instrument panel.

10. The touch switch of claim 1 wherein said interior trim panel comprises a bezel.

11. The touch switch of claim 1 wherein said at least two conductive traces are insert molded during said second mold process.

12. The touch switch of claim 1 wherein said at least two conductive traces are formed on different planes.

13. A conductive plastic touch switch formed in an interior trim panel of a vehicle, the touch switch comprising:
    a plastic substrate forming a portion of an interior trim panel of a vehicle, a first side surface including at least two channels formed within said first side surface and a second side surface including a manual activation region opposite said at least two channels;
    at least two conductive plastic traces, said conductive plastic traces formed within said at least two channels; and
    a printed circuit board electrically attached to said at least two conductive traces;
    wherein said plastic substrate is formed during a first mold process and said at least two conductive plastic traces are in-molded during a second mold process.

* * * * *